United States Patent [19]

Kosonocky et al.

[11] 4,246,591
[45] Jan. 20, 1981

[54] CCD IMAGERS

[75] Inventors: Walter F. Kosonocky, Skillman, N.J.; Robert L. Rodgers, 3rd, Lancaster, Pa.

[73] Assignee: RCA Corporation, New York, N.Y.

[21] Appl. No.: 754,690

[22] Filed: Dec. 27, 1976

[30] Foreign Application Priority Data

Dec. 14, 1976 [GB] United Kingdom ............... 31953/76

[51] Int. Cl.$^3$ ..................... H01L 29/78; H01L 27/14; H01L 31/00; G11C 19/28
[52] U.S. Cl. ........................................ 357/24; 357/30; 307/221 D
[58] Field of Search ................ 357/24, 30; 307/221 D

[56] References Cited

U.S. PATENT DOCUMENTS

| 3,911,467 | 10/1975 | Levine et al. | 357/24 |
| 3,971,003 | 7/1976 | Kosonocky | 307/221 D |
| 4,012,759 | 3/1977 | Esser | 357/24 |
| 4,028,716 | 6/1977 | van Santen et al. | 357/24 |

OTHER PUBLICATIONS

Sequin et al. *Charge Transfer Devices* Academic Press, N.Y. (7/75) pp. 4, 5, 11–15, 62–69, 100, 101, 106–108.
Theunissen "Charge Transfer Devices, Part I" Microelectronique vol. 54 (8–9/74) pp. 317–324.

*Primary Examiner*—Gene M. Munson
*Attorney, Agent, or Firm*—Samuel Cohen; H. Christoffersen

[57] ABSTRACT

CCD imagers of the field transfer type which include a surface channel A register and a buried channel C register.

8 Claims, 5 Drawing Figures

CCD IMAGERS

The present application deals with charge coupled device (CCD) imagers and more particularly with CCD imagers of the field transfer type.

Figure 1:
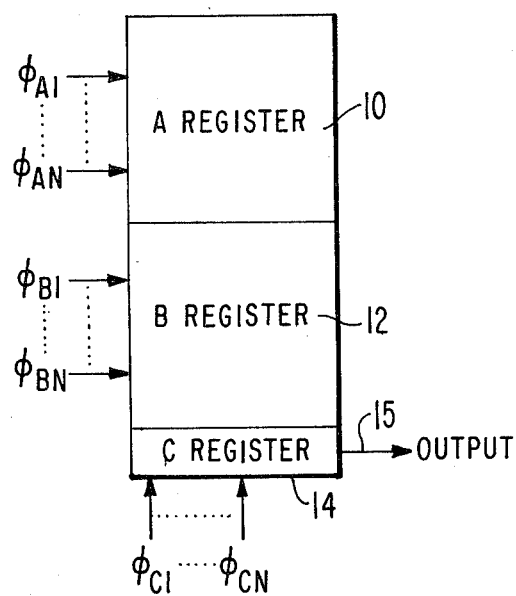
FIG. 1 is a block diagram of a CCD imager of the field-transfer type.

The system of FIG. 1, a CCD imager of the field transfer type, includes a photosensing array 10, known as an A register, a temporary storage array 12, known as a B register, and an output register 14, known as a C register. The B and C registers are masked, that is, means (not shown) are provided for preventing a radiant energy image from reaching either register.

The A and B registers have channel stops (those in the B register are illustrated, in part, in FIGS. 2 and 4) extending in the column direction to isolate the channels (the columns of the CCD) from one another. The electrodes (not shown in FIG. 1) may be of the single layer type comprising, for example, N type regions of polysilicon separated by P type regions of polysilicon as described in co-pending U.S. application Ser. No. 651,127 for "Charge Coupled Device Electrode Structure" filed Jan. 21, 1976, by R. L. Rodgers, 3rd and W. N. Henry and assigned to the same assignee as the present application. Alternatively, the electrodes may be of polysilicon overlapped by polysilicon or polysilicon overlapped by metal or other known CCD electrode structures. The imager can be two, three, four or higher phase operated. One such imager, commercially available from RCA Corporation is SID 51232 and known as "Big Sid", is three-phase operated and has 320 columns and 512 rows (256 in the A register and 256 in the B register).

The operation of the array of FIG. 1 is well understood. During the so-called integration time, a scene or other image is projected onto the A register. The light or other radiant energy of the image causes charges to be produced at the various locations of the A register, in accordance with the light intensity reaching the respective locations.

Upon the completion of the integration time (e.g. during the vertical blanking interval of commercial television), the charge signals which have accumulated (a "field") are transferred, in parallel, in the column direction from the A to the B register by the application of the multiple phase voltages $\phi A1 \ldots \phi AN$ and $\phi B1 \ldots \phi BN$, where N is an integer equal to the number of phases employed. The charges subsequently are transferred, a row at a time, from the B register to the C register, and after each row of charges reaches the C register, it is serially shifted out of the C register in response to the shift voltages $\phi C1 \ldots \phi CN$. The serial shifting of the C register occurs at relatively high speed (e.g. during a "line time " of commercial television). During the transfer of a field from the B to the C register, a new field may be integrated in the A register.

The "Big Sid" imager mentioned above is one of the surface channel type, that is, the A, B and C registers are all surface channel CCD's. This form of imager, i.e. surface channel type, has a number of important operating advantages. One is that the dark currents produced in the A register are relatively low. Another is that for a given cell geometry (channel width and electrode area) a relatively large amount of charge can be stored. Put another way, for a given amount of charge it is desired to store, the channel width and electrode area can be relatively small and this permits high packing density, that is, a relatively large number of charge storage locations can be accomodated on a given area of the substrate. Still another advantage of employing a surface channel A register is that it permits the employment of so-called operational blooming control, as described in U.S. Pat. No., 3,931,465 for "Blooming Control for a Charge Coupled Imager", issued Jan. 6, 1976 to P. A. Levine.

While surface channel imagers can provide extremely good pictures, there is still room for improvement. It is found, in practice, that the C register, in particular, is one of the components that is a limitation on obtaining even higher quality pictures. The surface channel C register requires, for optimum operation, the introduction of "fat zeros". In practice, in one particular system, these are serially introduced at one end of the register as the contents of the C register are being shifted out of the other end of the register, and they partially fill the wells in the C register. The subsequent row of information shifted from the B to the C register is superimposed over the fat zero charge signals present in the respective stages of the C register.

The reason for requiring fat zeros in surface channel CCD's is well understood in the art. In brief, surface channel CCD's exhibit defects known as "fast trapping states" at the substrate surface. These limit the charge transfer efficiency by taking charge from, or giving up charge to, the information charge signals, as the latter are propagated along the surface of the CCD channel. The use of fat zeros very substantially reduces this transfer loss and, in this way, improves charge transfer efficiency. However, the generation of the fat zeros for a surface chanel C register employing a single layer electrode structure has been found to constitute a source of noise.

Moreover, while the charge transfer efficiency of the surface channel C register is relatively high when operated in the fat zero mode, there is still some charge transfer loss (of the order of $10^{-3}$ to $10-4$ per charge transfer at clock frequencies of from 5 to 10 MHz) during the propagation of the charge signals along the C register. As the C register may have a relatively large number of stages (such as 320), this very small loss per stage results in a significant total loss for those signals undergoing large numbers of transfers. This transfer loss is manifested as a decrease in the horizontal resolution of the CCD imager.

There is one additional matter of a practical nature that is sometimes a problem in the operation of a surface-channel imager. One use for the imager is as a portable television camera and here it is important that the voltage, power and weight requirements be low. It is found, in practice, that the A and B transfer voltages can be relatively low (8 volts or so) because the transfers are at relatively low speed (about 200 KHz for the A-to-B register transfers and about 15.75 KHz for the B-to-C transfer). This voltage can be supplied by an ordinary 12 volt battery. However, the C register transfers take place at much higher speed (about 6 MHz). It is found, in practice, that with a single layer electrode structure described in the co-pending application mentioned above, a voltage of about 15 volts is required for the C register clock voltages $\phi_{C1}-\phi_{C3}$. A DC-to-DC converter is employed to obtain this 15 volts from the 12 volt supply battery. It adds to the expense and complication of the system. Moreover, the increased voltage and need for the converter substantially increases the power consumption of the system and thereby reduces the battery life.

In an improved CCD imager of the field transfer type embodying the invention, the A register 10 of FIG. 1 remains a surface channel CCD; however, the C register 14 is a buried channel CCD register. The B register preferably remains a surface channel register but it can instead be a buried channel register. This latter embodiment has the disadvantage that its charge capacity per potential well, assuming no change in electrode area or channel width is substantially smaller than that of a surface channel register.

Figure 3:
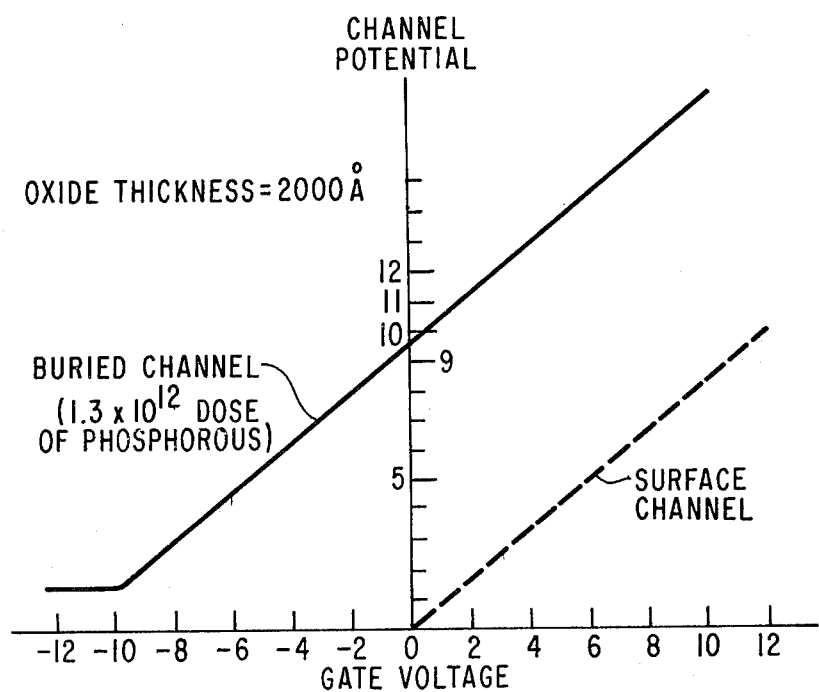
FIG. 3 is a graph showing the channel potential as a function of gate voltage of buried channel and surface channel CCD's.

With an imager such as shown in FIG. 1 employing a buried channel C register, a typical charge transfer loss per stage in the C register is $10^{-4}$ to $10^{-5}$ at clock frequencies of 10–20 MHz. In addition, fat zeros are not employed in the C register. Because there is substantially lower charge transfer loss, the horizontal resolution is substantially improved, and because fat zeros do not have to be serially shifted into the C register, they do not introduce noise into the C register. Further, it is found, in practice, that the clock voltage needed for operation of the buried channel C register at 6 MHz is 12 volts or less and this can be derived from the 12 volt battery without the need for an up-converter. (See in this connection FIG. 3 which illustrates that at a given gate electrode potential, a greater channel potential is introduced in a buried channel CCD than in a surface channel CCD, and see also the operation depicted in FIG. 5.) The power required for operation of the buried channel C register also is found to be substantially lower than for the corresponding surface channel C register.

Figure 2:
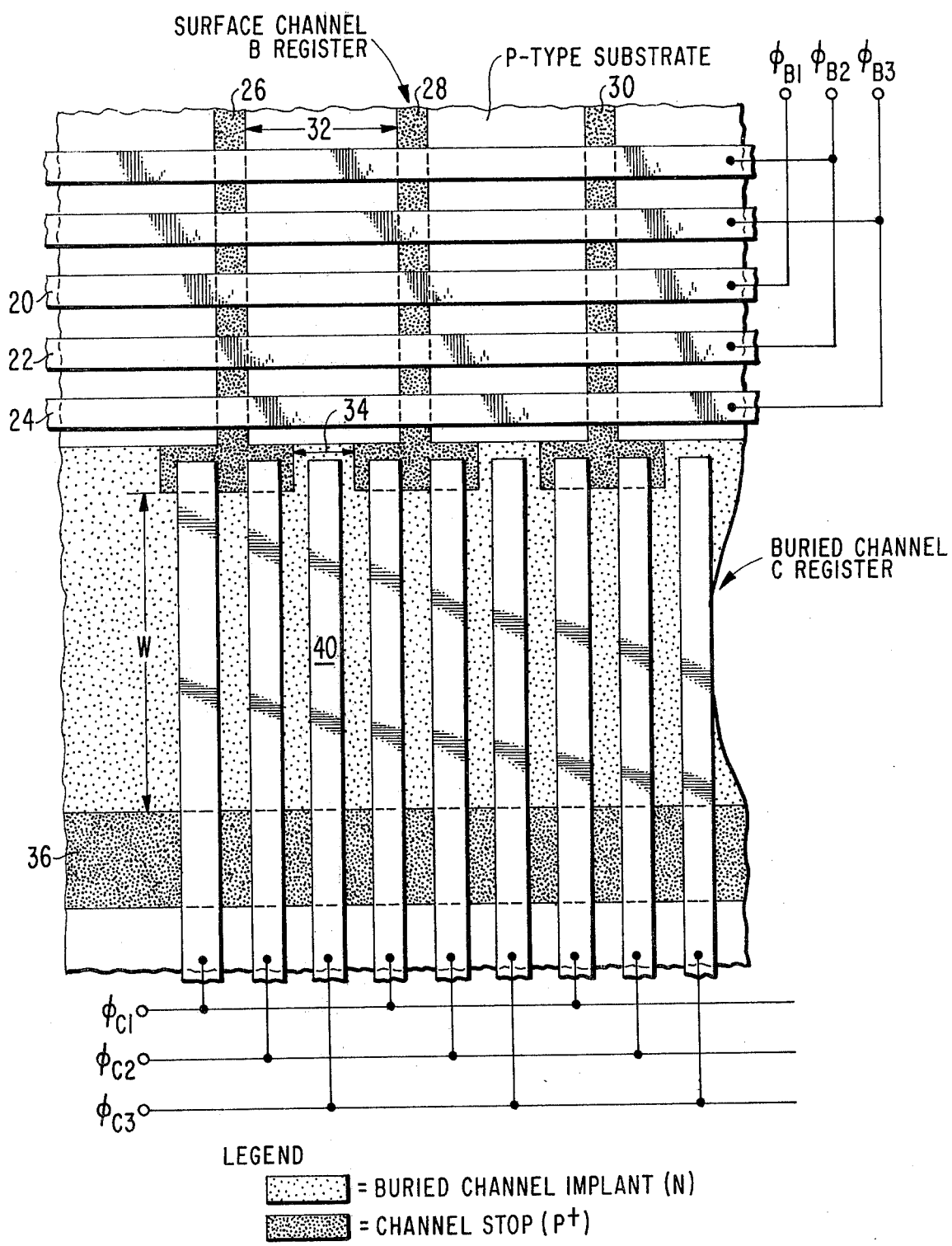
FIG. 2 is a plan view of a portion of such an imager according to one embodiment of the invention.

In an imager embodying the invention, all registers may be a common semiconductor substrate (a single chip) and the ones illustrated by way of example have P-type substrates. The A and B registers of the embodiment of FIG. 2 are both of the surface channel type and are three-phase operated. The B and C registers of one embodiment of the invention are shown, in part, in FIG. 2. The electrodes such as 20, 22 and 24 may be of the single layer type and are illustrated schematically. Vertical P+ diffusions (channel stops) such as 26, 28 and 30 define the boundries of the vertical CCD channels. Each such channel comprises a surface channel CCD. A typical channel such as 32 may have a width of 1 mil (0.001 inch). The channel stops are of expanded width at their ends to define small openings such as 34 through which charges may flow to the C register.

The C register comprises a buried channel register as indicated by the light stippling. The substrate is of P type and the buried channel may comprise a very thin N type region at the surface of the substrate and forming a PN junction with the substrate. The buried channel is bounded at one edge by a channel stop such as the P+ diffusion 36. Because the capacity of a potential well for a given electrode area is smaller in a buried channel than in a surface channel register, the buried channel is made of substantially greater width (a practical multiple is two or more) than the vertical surface channels of the B register. In one practical design, for example, the buried channel width w is two mils for a B register employing one mil wide channels 32.

The operation of the system of FIG. 2 is relatively straightforward. After an integration time, the contents of the A register (FIG. 1) are shifted into the B register. Assume, for example, that upon the completion of this transfer, a row of charge signals temporarily is stored beneath a phase 1 ($\phi_{B1}$) electrode 20. At this time the $\phi_{B1}$ voltage is relatively positive and the $\phi_{B2}$ and $\phi_{B3}$ voltages are less positive and may be zero. This row of charge signals subsequently is shifted by the $\phi_{B2}$ and $\phi_{B3}$ voltages, first beneath electrode 22 and then beneath electrode 24. When $\phi_{B3}$ goes positive, $\phi_{C3}$ also goes relatively positive, creating a potential well beneath the $\phi_{C3}$ electrodes such as 40. The charge signal now present in a channel such as 32 beneath electrode 24 passes beneath electrode 40 in the C register. The charge transfer from the B to the C register is completed when the $\phi_{B3}$ voltage returns to its low value while $\phi_{C3}$ voltage remains high. In one practical design, the voltage swing of the B register multiple phase voltages such as $\phi_{B3}$ may be from 0 to 11 volts and the voltage swing of the C register multiple phase voltages such as $\phi_{C3}$ may be $-2$ to $+8$ volts, in both cases assuming zero substrate bias. It may be observed from FIG. 3 that at these voltage levels (other choices also are possible), the substrate potentials are such as to cause the transfer of charge from the region of channel 32 beneath the electrode 24 to the region of the substrate beneath electrode 40. Note that in the B register the 0 to 11 volt swing corresponds to a 0 to roughly $8\frac{1}{2}$ volt swing in the substrate surface potential and in the C register the $-2$ to $+8$ volt swing results in a channel potential swing of from somewhat over 8 volts to 16 volts or so.

The operation just described occurs in all of the vertical channels, that is, the row of charge signals stored beneath electrode 24 is shifted, in parallel, to beneath the $\phi_{C3}$ electrodes of the C register. Thereafter, the $\phi_{C1}-\phi_{C3}$ voltages propagate the charge signals along the length of the C register to produce serial video signals at the output terminal (shown at 15 in FIG. 1) of the C register.

While in the embodiment illustrated in FIG. 2 the surface-to-buried channel transition occurs beyond electrode 24, it is also possible to have the transition occur beneath electrode 24.

Figure 4:
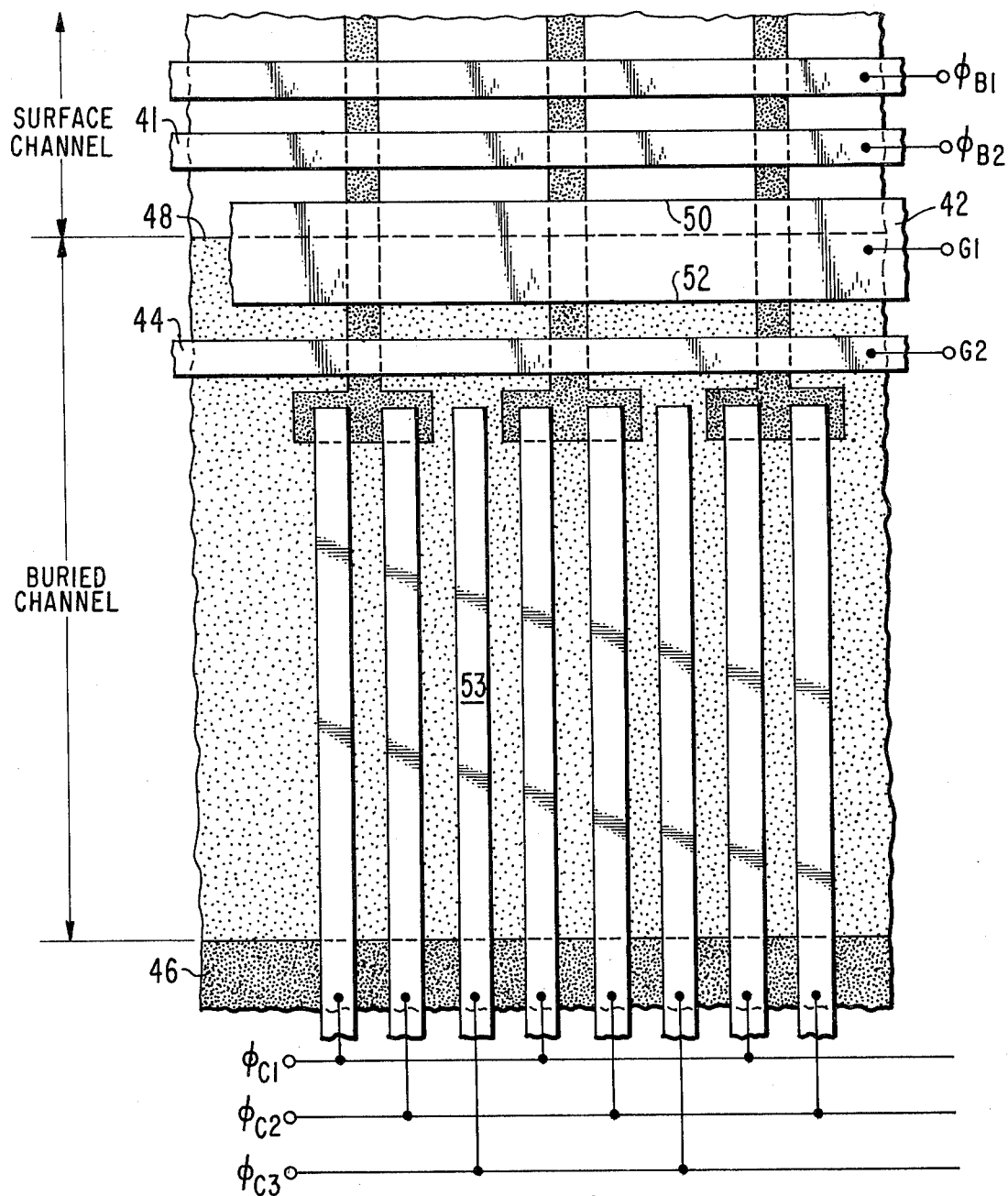
FIG. 4 is a plan view of a portion of an imager of the field transfer type according to a second embodiment of the invention.

A second embodiment of the invention is illustrated in FIG. 4. It differs from the embodiment of FIG. 2 in that the B register includes two additional electrodes 42 and and 44, electrode 42 being substantially wider than the remaining B register electrodes and also wider than electrode 44. The buried channel extends from channel stop 46 to beneath electrode 42. It is not necessary to align the edge 48 of the buried channel too precisely. This edge 48 should occur substantially closer to the edge 50 of electrode 42 than to the edge 52 of this electrode and alignment this coarse is relatively easy to achieve. Also the wide electrode 42 provides a potential well of increased capacity (compared to the case of a narrow electrode under which both buried and surface channel regions are present). The increased capacity of the potential well permits the temporary storage of charge while charge in the C register is being shifted out of the C registed as illustrated in FIG. 5.

Figure 5:
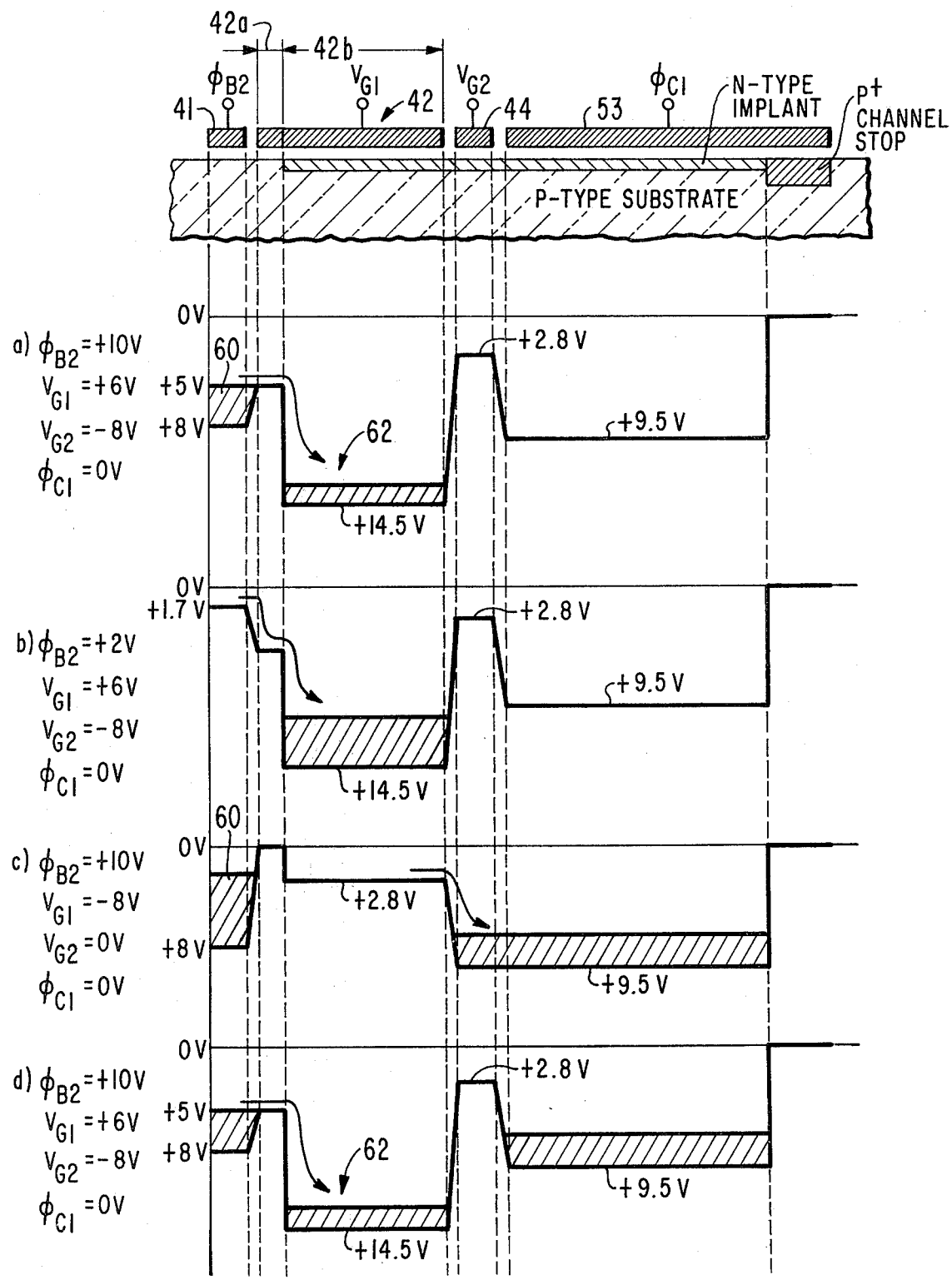
FIG. 5 shows diagrammatically a section through the imager of FIG. 4 and substrate potential profiles during operation of the imager.

The operation of the embodiment of FIG. 4 during the transfer from the B to the C register is illustrated in FIG. 5. The various substrate potentials illustrated may be obtained from the graph of FIG. 3 which shows the relationship between the gate electrode potential and the substrate potential. FIG. 5 illustrates at a the various substrate potentials at the time charge signal arrives at the $\phi_{B2}$ electrode 41. This electrode is at $+10$ volts to produce a substrate surface potential of 8 volts. Electrode 42 is at a voltage of $+6$ volts to produce a substrate surface potential of 5 volts beneath region 42a of electrode 42 and to produce a buried channel potential of $+14.5$ volts beneath portion 42b of electrode 42. Assuming a relatively full potential well 60 beneath electrode 41, some of the charge signals will pass over the 5 volt barrier and into the potential well 62 beneath portion 42b of electrode 42.

During the following time period, illustrated at b, FIG. 5, the potential $\phi_{B2}$ of electrode 41 is reduced from $+10$ volts to $+2$ volts. The surface potential beneath electrode 41 is reduced correspondingly to about $+1.7$ volts so that the remainder of the charge signal beneath electrode 41 flows into well 62. During this period (and also during the previous period), gate electrode 44 is at a potential $V_{G2}$ of $-8$ volts to produce a $+2.8$ volt barrier which prevents any of the charge signal beneath electrode 42 from flowing into the C register.

During the following time interval illustrated at c in FIG. 5, the potential $V_{G1}$ applied to electrode 42, is decreased from $+6$ volts to $-8$ volts and concurrently the potential $V_{G2}$ applied to electrode 44 is increased from $-8$ volts to 0 volts. The result of these changes is to decrease the depth of the potential well beneath region 42b of electrode 42 and to drop the potential barrier beneath electrode 44 so that is assumes the same buried channel potential of $+9.5$ volts as beneath electrode 53 of the C register. The charge signal stored beneath portion 42b of electrode 42 transfers to beneath electrodes 44 and 53 in response to these conditions as illustrated at c in FIG. 5. At the same time, the decrease in the voltage $V_{G1}$ increases the height of the barrier beneath region 42a of electrode 42 from 5 volts to 0 volts. At the same time, the voltage $\phi_{B2}$ applied to electrode 41 is increased from $+2$ to $+10$ volts so that new charge signal from the B register passes into the 8 volt well thereby formed. Even though this may be a full well charge, it cannot be propagated to beneath electrode 42 because of the zero volt barrier beneath region 42a of electrode 42.

FIG. 5 illustrates at d the same conditions as illustrated at a. The operation is believed to be self-evident from this figure. Note that $V_{G2}$ is at $-8$ volts so that there is a $+2.8$ volt buried channel barrier isolating the B register from the C register. The charge signal beneath electrode 53 can now be propagated at high speed along the length of the C register to produce the serial video output signals at output terminal 15 of FIG. 1.

While not illustrated in plan view, it is also possible to make both the B and the C registers of the buried channel type. The transition from the surface channel A register in this case can be made employing the technique illustrated in FIG. 2 or, if desired, a special greater width gate electrode may be employed as illustrated in FIGS. 4 and 5. As already mentioned, a disadvantage of this approach is that the B register will have a smaller full well charge signal capacity than the surface channel A register of the same geometry. This inherent characteristic cannot be compensated for without introducing other problems. For example, if the electrodes are made wider in the B channel to increase their area, this will reduce vertical resolution. However, if only the C register is buried channel, as illustrated in FIGS. 2, 4, and 5, increased charge storage capacity can easily be obtained by increasing the width of the CCD channel of the C register as illustrated. Doing this does not decrease resolution because the increased width is in the vertical direction. Horizontal resolution is increased for the reasons already discussed.

A buried channel register for a P type substrate (N-channel) imager of the type illustrated may be made in the following way. First, prior to depositing any of the electrodes, a relatively thick (5,000 Å) silicon dioxide layer (oxide) may be thermally grown on the substrate by heating the same. Then, employing photolithographic techniques, the oxide may be removed from that portion of the substrates where the buried channel is to be formed. Then an N type material, such as phosphorous, may be implanted into the substrate. In one practical method employing phosphorous, a dose of $1.3 \times 10^{12} \text{cm}^{-2}$ was implanted at a voltage at a voltage of 200 KeV. The remainder of the fabrication of the imager is conventional. The channel oxide thickness for all of the registers including the buried channel register may be 2,000 Å, and this oxide may be thermally grown.

While the various embodiments of the invention illustrated by way of example are shown to employ P type substrates and N type implants to provide the buried channels, it is of course to be understood that N type substrate surface channel devices may be used instead and that the buried channels can be formed as P type regions at the surface of the substrate, with corresponding changes in operating voltage polarities.

What is claimed is:

1. A charge-coupled device (CCD) imager of the field-transfer type comprising:

a surface channel CCD A register including a substrate formed with channels extending in a column direction, the opposite edges of each channel being defined by potential barriers in the substrate for confining any charge which may be present in a channel to the channel, said A register also having electrodes extending in a row direction substantially orthogonal to said column direction, over said channels, responsive to applied voltages for the storage in and transfer of charges along said channels, said register for producing and storing charge signals in response to a radiation image projected onto said register;

a CCD B register coupled to said A register into which a field of charge signals from said A register may be shifted for temporary storage in said B register, said B register including a substrate formed with channels aligned with corresponding channels of the A register, the opposite edges of each such channel in said B register also being defined by potential barriers in the substrate for confining any charge which may be present in a channel to that channel, said B register having electrodes extending in the row direction over the channels of said B register responsive to applied voltages for the storage in and transfer of charge along the channels of said B register; and a buried channel CCD C register including a semiconductor formed with a channel extending in the row direction and having opposite edge regions defined by potential barriers in the semiconductor extending in the row direction for confining any charge which may be present in said channel to said channel, said channel comprising a semiconductor surface layer of one conductivity type over a semiconductor of opposite conductivity type, said channel of said C register being coupled to the channels of said B register for receiving charge signals, in parallel, a row at a time, from said B register, and said C register also including electrodes extending in the column direction over its channel for the storage in and transfer of charge along the channel of said C register.

2. A charge-coupled device imager as set forth in claim 1 wherein each channel in the A register is of substantially the same width in the row direction between its opposite edges, and wherein the channel of said C register has a width in the column direction between its opposite edge regions which is substantially greater than the width of said CCD channels of the A register.

3. A charge-coupled device imager as set forth in claim 2 wherein said width of said CCD channel of said C register is at least double that of said CCD channels of said A register.

4. A charge-coupled device imager as set forth in claim 1 wherein the channels of said B register are followed by a first gate electrode of substantially greater width than said other electrodes, followed by a second gate electrode, said second gate electrode being located immediately adjacent to said C register, said first and said second electrodes being positioned to control the flow of charge from all of the CCD channels of said B register, and wherein said semiconductor surface layer of said C register extends from said C register to at least partially beneath said first gate electrode over substantially the entire length of said first gate electrode.

5. A charge-coupled device imager as set forth in claim 1 wherein the last one of the electrodes of said B register is located immediately adjacent to said C register, and wherein said semiconductor surface layer of said C register terminates at a region of the substrate beyond said last of said electrodes and not overlapped by the last of said electrodes.

6. A charge-coupled device imager as set forth in claim 1 wherein the last one of the electrodes of said B register is located immediately adjacent to said C register, and wherein the semiconductor surface layer of said C register extends to beneath said last one of said gate electrodes over substantially the entire length of said last electrodes.

7. A charge-coupled device imager as set forth in claim 1 wherein said B register comprises a buried channel register.

8. A charge-coupled device imager as set forth in claim 1 wherein said B register comprises a surface channel register.

* * * * *